United States Patent [19]
Watanabe et al.

[11] Patent Number: 4,872,032
[45] Date of Patent: Oct. 3, 1989

[54] IMAGE FIXING DEVICE

[75] Inventors: Satoshi Watanabe, Nagoya; Hiroto Sugahara, Ichinomiya; Takesi Izaki, Nagoya, all of Japan

[73] Assignee: Brother Kogyokabushiki Kaisha, Nagoya, Japan

[21] Appl. No.: 157,478

[22] Filed: Feb. 17, 1988

[30] Foreign Application Priority Data

| Feb. 18, 1987 | [JP] | Japan | 62-36413 |
| Feb. 18, 1987 | [JP] | Japan | 62-36414 |
| Feb. 18, 1987 | [JP] | Japan | 62-36416 |
| Feb. 18, 1987 | [JP] | Japan | 62-36417 |
| Feb. 27, 1987 | [JP] | Japan | 62-45688 |

[51] Int. Cl.$^4$ .................................................. G03B 5/02
[52] U.S. Cl. ...................................... 354/297; 354/304; 355/27; 430/138
[58] Field of Search ............... 354/297, 304, 301, 303; 355/27; 430/138

[56] References Cited

U.S. PATENT DOCUMENTS

| 4,448,516 | 5/1984 | Arney et al. | 355/27 |
| 4,624,560 | 11/1986 | Beery | 355/27 |
| 4,648,699 | 3/1987 | Holycross et al. | 355/27 |
| 4,714,943 | 12/1987 | Sakakibara et al. | 355/27 |
| 4,727,392 | 2/1988 | Stone et al. | 355/27 |

*Primary Examiner*—A. A. Mathews
*Attorney, Agent, or Firm*—Kane, Dalsimer, Sullivan, Kurucz, Levy, Eisele, and Richard

[57] ABSTRACT

An image fixing device comprises a supporting platform for supporting thereon a recording sheet on which a provisional image is formed, one or more of rollers adapted to roll over the surface of the recording sheet in a direction substantially transversely of a paper feeding direction, and a resilient member for applying a downward force to the rollers to thereby apply pressure to the surface of said recording medium for fixing the provisional image under pressure. The rollers are connected to an arm rotating or swinging about a shaft extending vertically with respect to the platform. The swinging amplitude may be adjusted to become applicable to recording sheets of different width. The resilient member may be a coil spring coiled around the shaft in such manner as to apply a downward directing force to the rollers. Alternatively, the resilient member may be a shaft spring which comprises the rotating or swinging arm.

21 Claims, 14 Drawing Sheets

IMAGE FIXING DEVICE

BACKGROUND OF THE INVENTION

This invention relates to a device for fixing an image under pressure on a recording medium, used in connection with electronic copiers, printers, facsimiles, and the like.

With such copying and printing machines, an image of a manuscript is electrostatically or electromagnetically formed on a sheet-shaped recording medium as a toner image or formed as a latent image on a recording medium carrying a plurality of photo-sensitive microcapsules each containing color ink or the like by exposing an optical image thereon. The image thus formed is then fixed or developed on the same or a separate recording medium with an image fixing device which applies constant pressure uniformly over the entire surface of the recording medium to fix or develop the image.

One example of the image fixing device is disclosed in Japanese Patent Provisional Publication No. SHO57-185067, in which a lower support roller and an upper press roller are opposedly arranged and brought into contact with each other to provide a predetermined contact pressure therebetween. A recording medium on which a toner or latent image has been formed is adapted to pass between these rollers so that said predetermined pressure is applied to the surface of the recording medium to fix or develop the toner or latent image.

With the said prior art device, however, since the upper press roller contacts with the lower support roller over the entire width thereof, there is required an extremely great contact pressure in order to provide substantially uniform pressure all over the entire surface of the recording medium. To meet this requirement, it would be necessary to strengthen shafts of these contact rollers and a frame for supporting the rollers, resulting in considerable increase of the size and a manufacturing cost of the device. Meanwhile, fixing or developing quality will be degraded if pressure is not applied uniformly over the entire surface of the recording medium.

SUMMARY OF THE INVENTION

It is therefore an object of this invention to provide an image fixing device capable of effectively fixing or developing an image on a recording medium with a relatively small degree of pressure, thus decreasing the size and manufacturing cost of the device.

According to an aspect of this invention there is provided an image fixing device comprising support means for supporting thereon a recording medium on which a provisional image is formed, roller means adapted to roll over the surface of the recording medium in a direction substantially transversely of a feeding direction of said recording medium, and resilient means for applying a downward force to the roller means to thereby apply pressure to the surface of the recording medium for fixing said provisional image under pressure.

With the image fixing device as above constructed, as the pressure is applied to the recording medium by the roller means which rolls over the surface of the recording medium, it is easy to uniformly apply the pressure.

Optionally, the roller means may be shaped like barrel for providing a minimum contact area with the recording medium, so that resiliency of the resilient member is focused to the contact area therebetween. Thus, a sufficient degree of pressure can be obtained with small resiliency.

BRIEF DESCRIPTION OF THE ACCOMPANYING DRAWINGS

DESCRIPTION OF THE PREFERRED EMBODIMENTS

Figure 1:
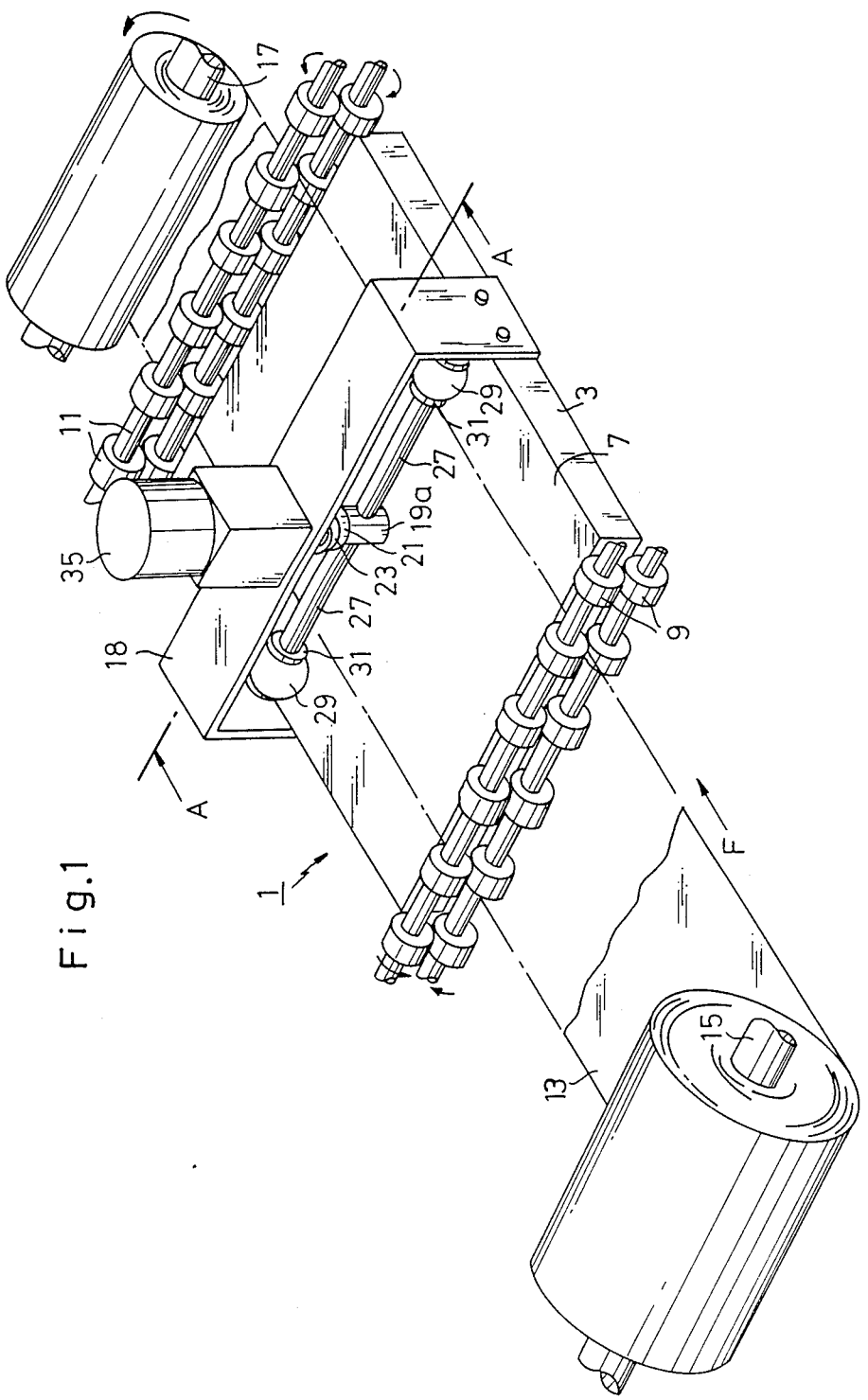
FIG. 1 is a diagrammatic perspective view showing an image fixing device embodying the invention.
Figure 2:
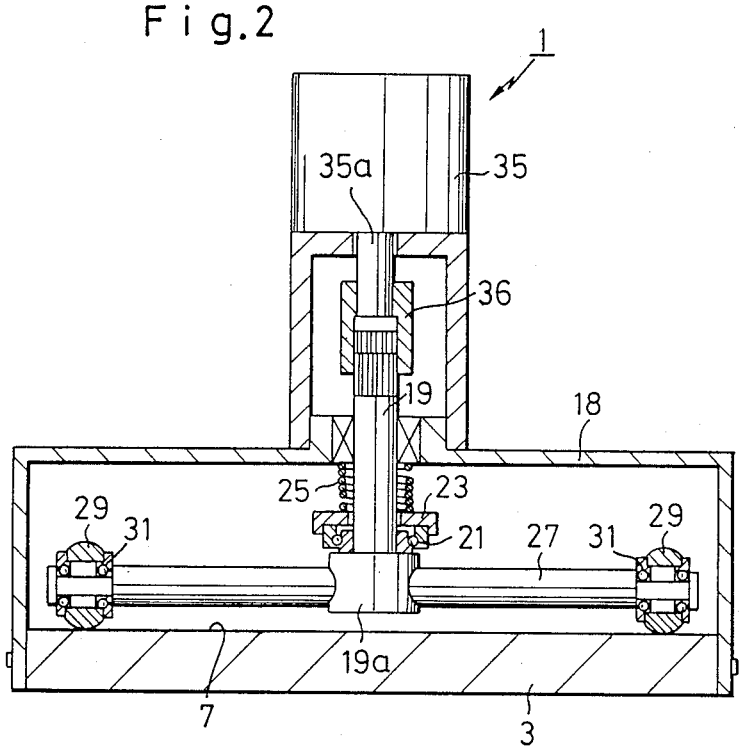
FIG. 2 is a vertical sectional view taken along the line A—A in FIG. 1.

FIG. 1 illustrates an image fixing device embodying the invention, which is so designed as to apply pressure onto the surface of a photo-sensitive capsule paper carrying thereon microcapsules each enveloping therein different color ink so that uncured microcapsules are ruptured to allow the inside ink to react with another material on a separate recording sheet, thereby developing a colored visible image on the recording sheet. The capsule paper is, in this embodiment, prepared as a continuous elongated paper 13 which is fed from a supply reel 15 and, after travelling through the image fixing device 1, wound by a take-up reel 17. Between the supply reel 15 and the device 1, the capsule paper 13 is exposed to light whereby a portion of microcapsules are hardened or cured to form on the capsule paper a latent image of a manuscript. The recording sheet 5 is prepared as a cut-sheet having a predetermined size, with the width substantially identical to that of the capsule paper. The recording sheet 5 is supplied separately from the capsule paper 13, but joined with the capsule paper 13 from below just before the device 1 so that they are together introduced into the device 1 in a juxtaposed manner. After passing through the device 1, the recording sheet 5, on which the latent image has been duplicated to form a visible image, is again separated from the capsule paper 13 and discharged outside the device 1. A direction in which the capsule paper 13 and the recording sheet 5 is fed is generally shown by the arrow F.

The recording sheet 5 and the capsule paper 13 juxtaposed on the recording sheet 5 (herein later often referred to as "papers") are introduced into the device 1 by means of a first pair of paper feeding rollers 9 and discharged by means of a second pair of paper feeding rollers 11. These paper feeding rollers 9 and 11 are rotatably supported by the opposite ends of a frame 3 and rotated in the respective arrowed directions (in FIG. 1) in synchoronism with the take-up reel 17 to feed the papers in the direction F on a platform 7 of the frame 3.

A supporting frame 18 is bridged over platform 7. A vertically extending shaft 19 is rotatably and axially displaceably connected to the supporting frame 18. The shaft 19 is connected via a coupling 36 to a shaft 35a of a motor 35 mounted on an elevated central section of the supporting frame 18 so that it is rotated by the motor 35 in a counter clockwise direction (in FIG. 1) but the coupling 36 allows axial displacement of the shaft 19. A coil spring 25 coiled around the shaft 19 is interposed between the lower surface of the frame 18 and a ring 23 which may be rotated with respect to the rotating shaft 19 by means of a ball bearing 21 arranged therebetween, so that a lower enlarged end 19a of the shaft 19, and therefore the shaft 19 itself, are biased toward the platform 7 in its axial direction.

A pair of symmetrically extending arms 27 are secured to the lower end 19a and thus rotated together with the shaft 19. A pair of press rollers 29 are connected to the respective free ends of arms 27 via ball bearings 31. Rollers 29 are made of tough and wear-resistant material such as metal and ceramics and shaped like barrel which will provide a minimum contact area with the capsule paper 13 travelling on the platform 7. Thus, the rollers 29 will contact the capsule paper 13 with a downward force or load which is essentially governed by resiliency of the coil spring 25, which is usually of the order of 20~40 kg.

Figure 3:
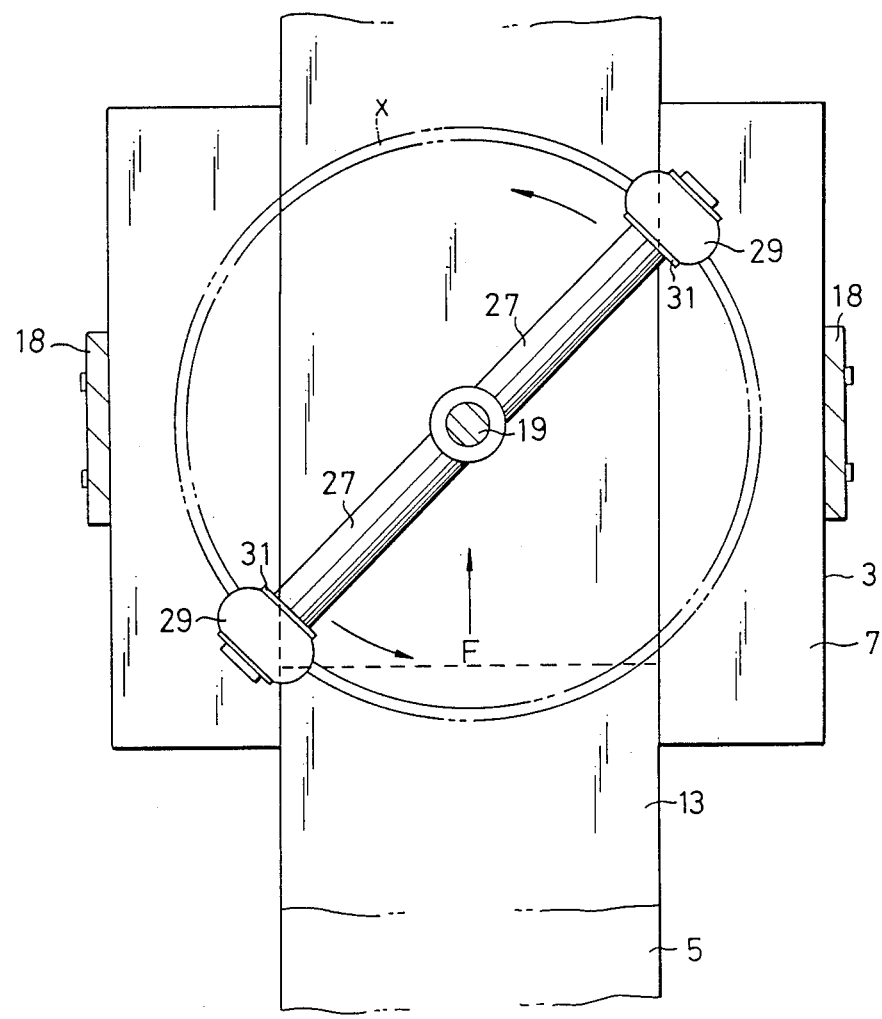
FIGS. 3 and 4 are explanatory views showing the operation of the device shown in FIG. 1.

Functional operation of the device 1 thus constructed will be described while referring specifically to FIGS. 3 and 4. In response to a pulse signal generated from a sensor (not shown) arranged at a downstream in the paper feeding direction F when it detects the forefront of recording sheet 5, motor 35 is energized to cause shaft 19 to rotate in a counter clockwise direction. Thus, rollers 29 roll over the capsule paper 13 on a circular locus (x) shown by imaginary lines in FIG. 4. As shown, since the radius of the circular locus (x) determined by the length of the arm 27 is enough larger than the width of the papers, rollers 29 will be moved on the papers in a direction of substantially transversely of the paper feeding direction (F), as shown in FIG. 3. A particular area of the capsule paper 13 is subjected to contact with the rollers 29 twice while travelling on the platform 7. Thus, uncured microcapsules on the capsule paper 13 may surely be ruptured under pressure exerted by rollers, thereby transfer the latent image thereon to the surface of the recording sheet 5 to form a visible image.

Figure 4:
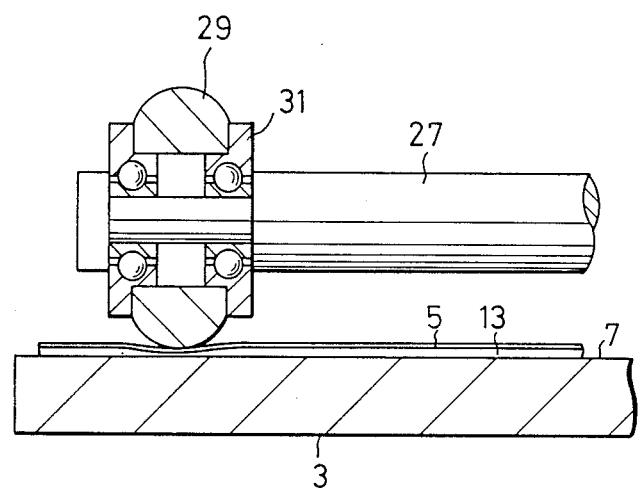

The manner in which a sufficient pressure is applied to the capsule paper 13 at a particular contact area is best shown in FIG. 4. Since rollers 29 are shaped like barrel to provide a minimum contact area with the surface of the capsule paper 13, pressure governed by resiliency of the coil spring is focused on the contact area. This also means that such contact pressure may easily be adjusted by using a coil spring having different resiliency.

With the above constructed fixing device, it is possible to develop a visible image by utilizing members rolling over the surface of the capsule paper under pressure determined by resiliency of a resilient member, and therefore it is possible to provide an image fixing device of a smaller size at a lower manufacturing cost. Further, since the press rollers are so shaped as to provide the minimum contact area with the capsule paper and capable of focusing pressure exerted by the press rollers on a particular contact area of the capsule paper, it is possible that the uncured microcapsule coated on the capsule paper is surely ruptured.

Figure 5:
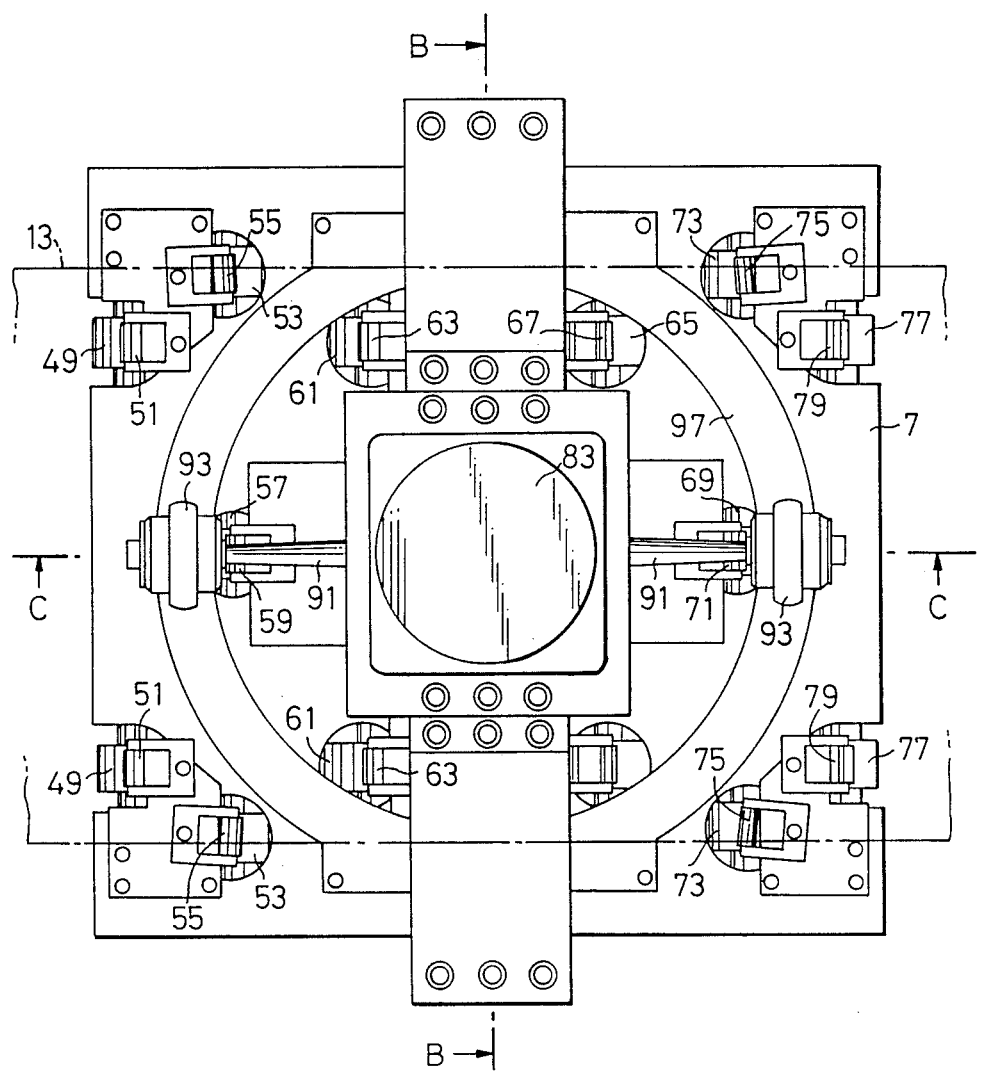
FIG. 5 is a diagrammatic plan view showing a modified embodiment of the image fixing device.
Figure 6:
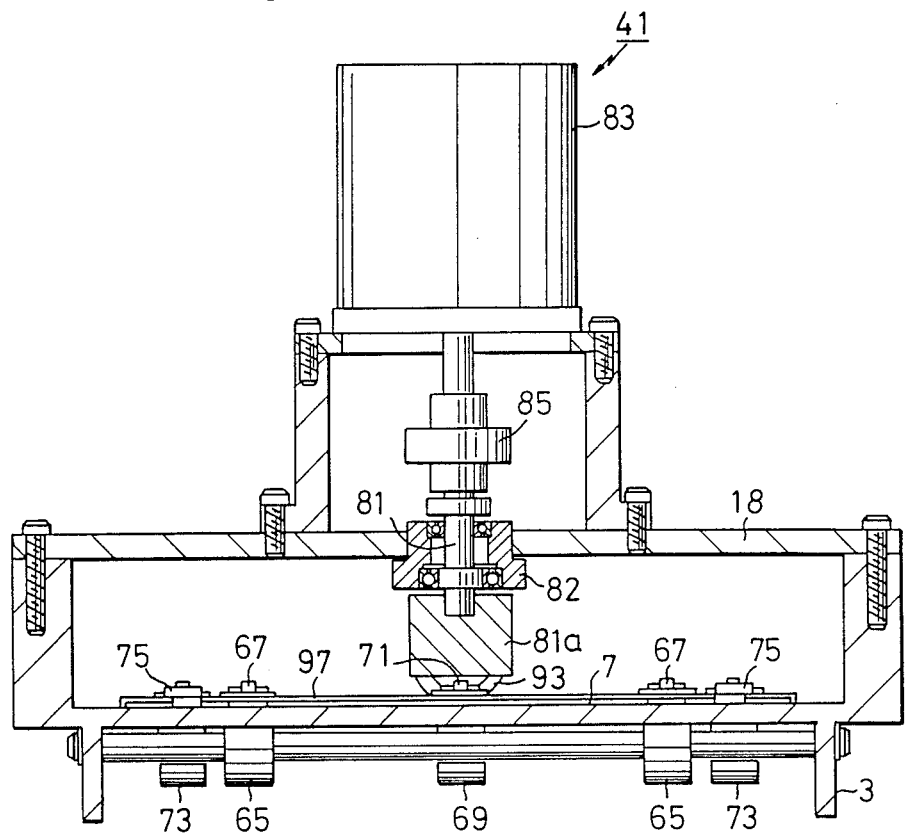
FIG. 6 is a vertical sectional view taken along the line B—B in FIG. 5.
Figure 7:
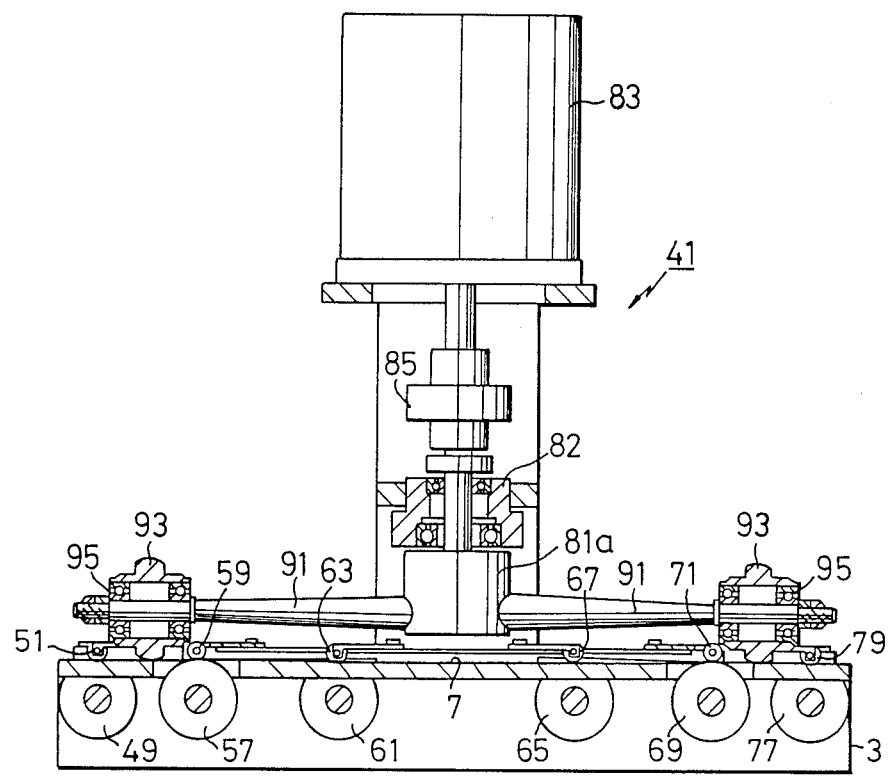
FIG. 7 is a vertical sectional view taken along the line C—C in FIG. 5.

FIGS. 5 to 7 show a modified fixing device which is so designed as to prevent disadvantages which might be encountered in operating the fixing device of FIG. 1. More particularly, with the fixing device of FIG. 1, since the capsule paper are continuously fed in the direction (F), where press rollers are positioned out of the center line of the papers in the feeding direction (F), there will be generated an inwardly directing tension, which would result in wrinkles or deformation of the capsule paper. This will become serious when the papers are fed in a rapid speed. It is noted that sections and members identical with those of the device shown in FIGS. 1 to 4 are accompanied by the identical numerals in FIGS. 5 to 9.

The above modified device capable of eliminating the above disadvantage is generally referred to by a numeral 41. The papers, that is the recording sheet 5 and the capsule paper 13 juxtaposed thereon, are adapted to be fed in the direction (F) and conveyed on a platform 7 of a frame 3 by means of several pairs of lower support rollers and upper press rollers 49 and 51; 53 and 55; 57 and 59; 61 and 63; 65 and 67; 69 and 71; 73 and 75; 77 and 79, respectively. These roller pairs are rotated in the opposite directions by motor (not shown) in synchronism with each other to feed the papers in the direction (F). It is specifically noted that, as best shown in FIG. 5, the upper press rollers 55 and 75 are arranged along the opposite sides of the papers, at an outwardly directing oblique angle with respect to the paper feeding direction (F), thus giving an outwardly biasing tension to the opposite sides of the capsule paper 13 conveyed on the platform 7. This outwardly biasing tension will compensate the inwardly directing tension which is produced by the press rollers 93 described lalter.

A ring-shaped contact plate 97 is attached to the upper surface of the platform 7, which will be a moving path of the press rollers 93. The plate 97 is, for example, a stainless plate which is enough thin to be resiliently waved or deformed when the rollers 93 are moved thereon. Usually, the plate 97 should be about 0.1~0.4 mm in thickness.

The image fixing rollers 93 are rotatably connected to the opposite free ends of a pair of rotary arms 91, which is in turn secured to an enlarged lower end 81a of a shaft 81. Shaft 81 is rotatably supported, via a ball bearing 82, to a supporting frame 18, and connected via a coupling 85 to a motor 83 mounted on an elavated central section of a supporting frame 18. Shaft 81 is thus rotated by motor 83. Rotary arms 91 are made of shaft spring shaped substantially into a cone tapered toward rollers 93 and designed such that the capsule paper 13 of a particular area is, via contact plate 97, pressed by rollers 93 positioned thereon with a predetermined degree of load, of the order of about 20~40 kg.

Figure 8:
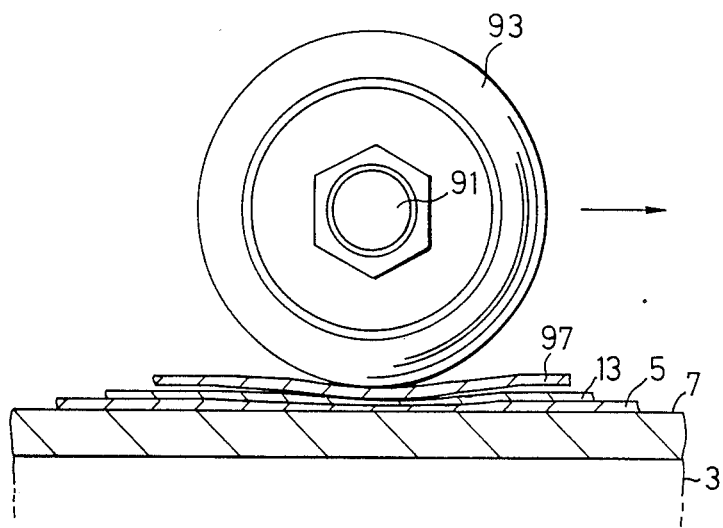
FIGS. 8 and 9 are explanatory views showing the operation of the device shown in FIG. 5.
Figure 9:
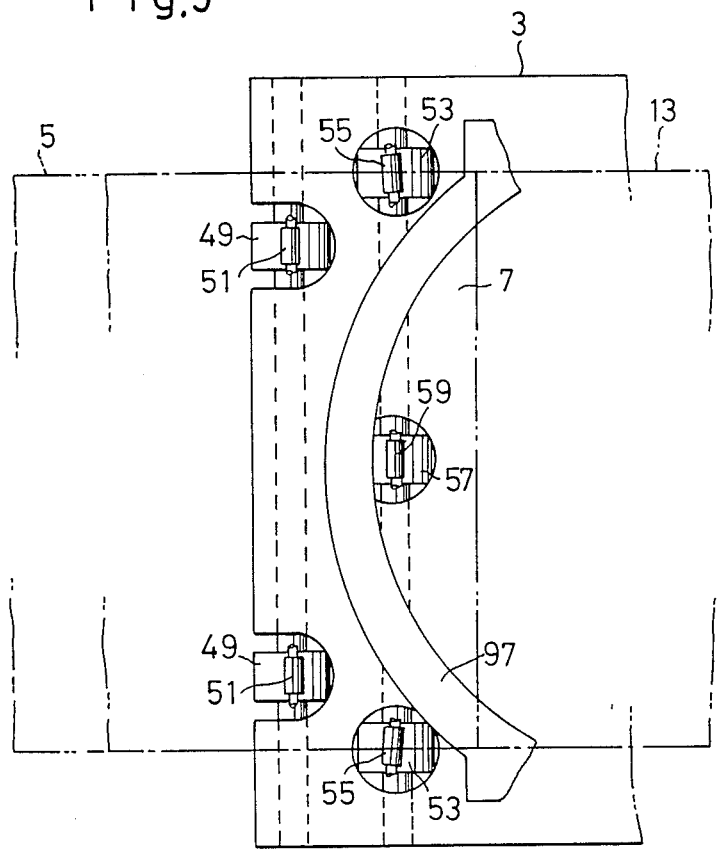

The manner in which pressure sufficient for rupture of uncured microcapsules is applied to the surface of the capsule paper 13 is best shown in FIG. 8. More particularly, when a sensor (not shown) arranged in the upstream of the device 41 detects the forefront of the recording sheet 5, the respective pairs of feed rollers are synchonizedly rotated to feed the papers in the direction (F). At the same time, the motor 83 is energized so that image fixing rollers 93 begin to rotate in a direction at a relatively high speed of revolution. Thus, rollers 93 succesively roll over contact plate 97 to thereby press the capsule paper 13 with a degree of pressure corresponding to resiliency of shaft springs 91. Color inks or developing agent contained in the ruptured microcapsules then flow onto the recording sheet 5 to duplicate the latent image thereon. With this embodiment, since the papers are positioned between platform 7 and contact plate 97, displacement or wrinkles of the papers will not occur even when pressure is applied thereto by means of rollers 93. Moreover, during conveyance of the papers, to both sides of the capsule paper is given outwardly biasing tension by the outwardly directing upper press rollers 53 and 75, as shown in FIG. 9 with respect to the rollers 45. The said outwardly biasing tension will compensate the inwardly biasing tension which may be applied to the paper by rollers 93 as described before, which will also be effective for preventing displacement or wrinkles of the papers.

Figure 10:
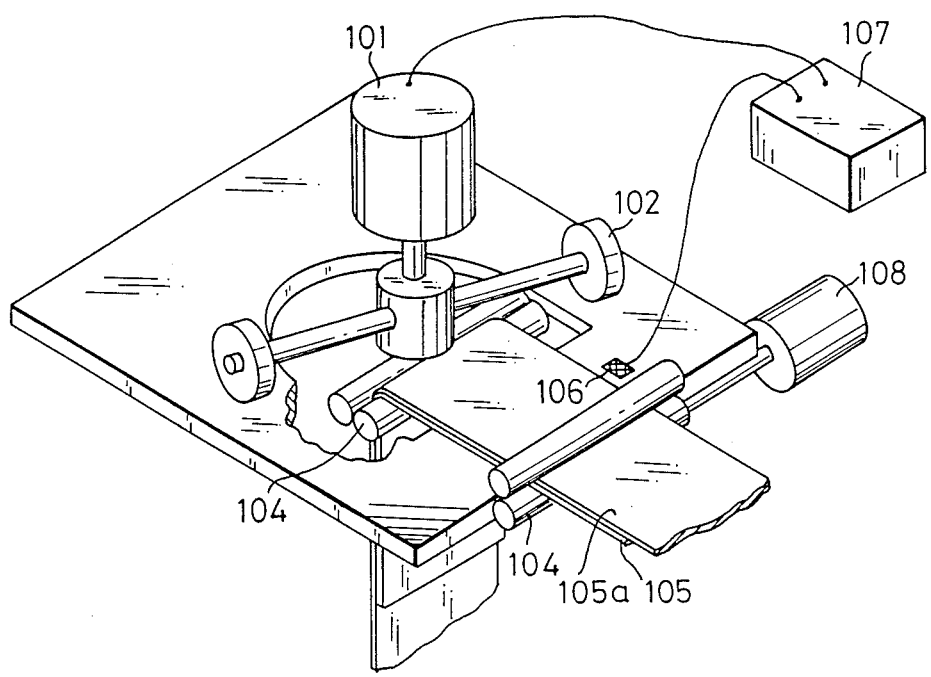
FIG. 10 is a diagrammatic perspective view showing still another modification of the device.
Figure 11:
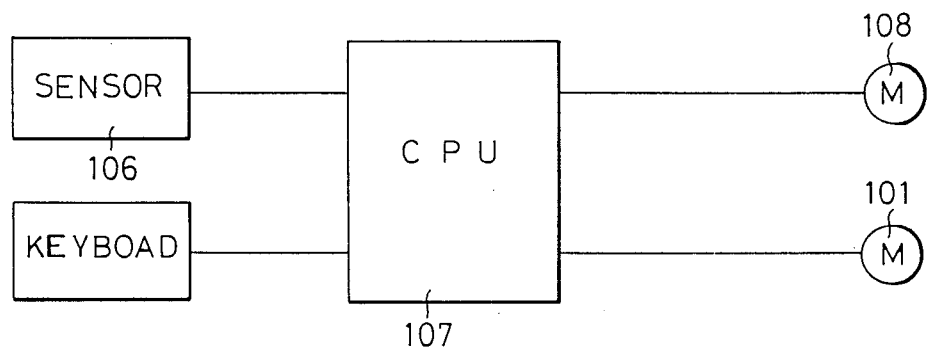
FIGS. 11 and 12 are a block diagram and a flow chart, respectively, showing the operation of the device shown in FIG. 10.
Figure 12:
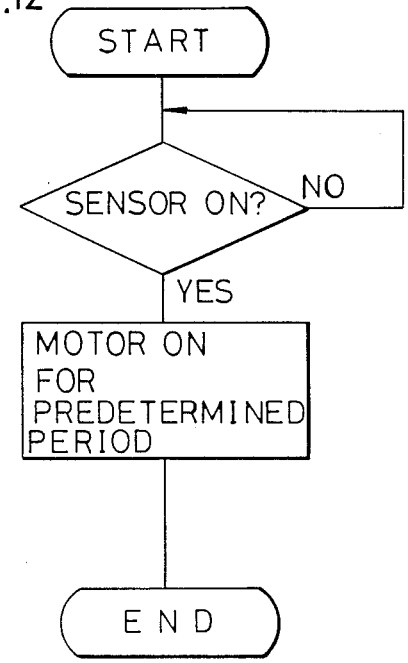

FIGS. 10 to 12 illustrates a still modified fixing device having another solution for preventing displacement or wrinkles of the papers during conveyance. The above-described problem of displacement or wrinkles of the paper is caused by the fact that while the papers are continuously supplied at a constant rate, a particular point or area just below the image fixing roller is stopped in that moment by the contact pressure therebetween, thus generating uneven tension against the papers. With the third embodiment, an automatic control means is provided to stop the conveyance of the papers while the image fixing rollers are positioned thereon. Thus, the above-described problem will not be found even when a high speed conveyance of the papers is adopted.

As shown in FIGS. 10 and 11, the still modified fixing device includes a sensor 106 mounted on a platform 103 for detecting the presence of the rollers 102 on the recording papers 105 and 105a, and a control device 107 connected to sensor 106. The control device 107 comprises CPU and is connected to a first motor 101 for rotating a pair of image fixing press rollers 102, a second motor 108 for driving pairs of paper feed rollers 104. These motors are switched on and off by control device 107 in response to a signal generated from sensor 106. More particularly, when press rollers 102 are moved to the outside of the papers, sensor 106 detects such position of rollers to generate the signal to control device 107 which will then switch motor 108 on for a predetermined period to feed the papers. While press rollers 102 roll over the surface of the papers, control device 107 is operated such that the paper feed is interrupted, thus preventing displacement or wrinkles of the papers.

Figure 13:
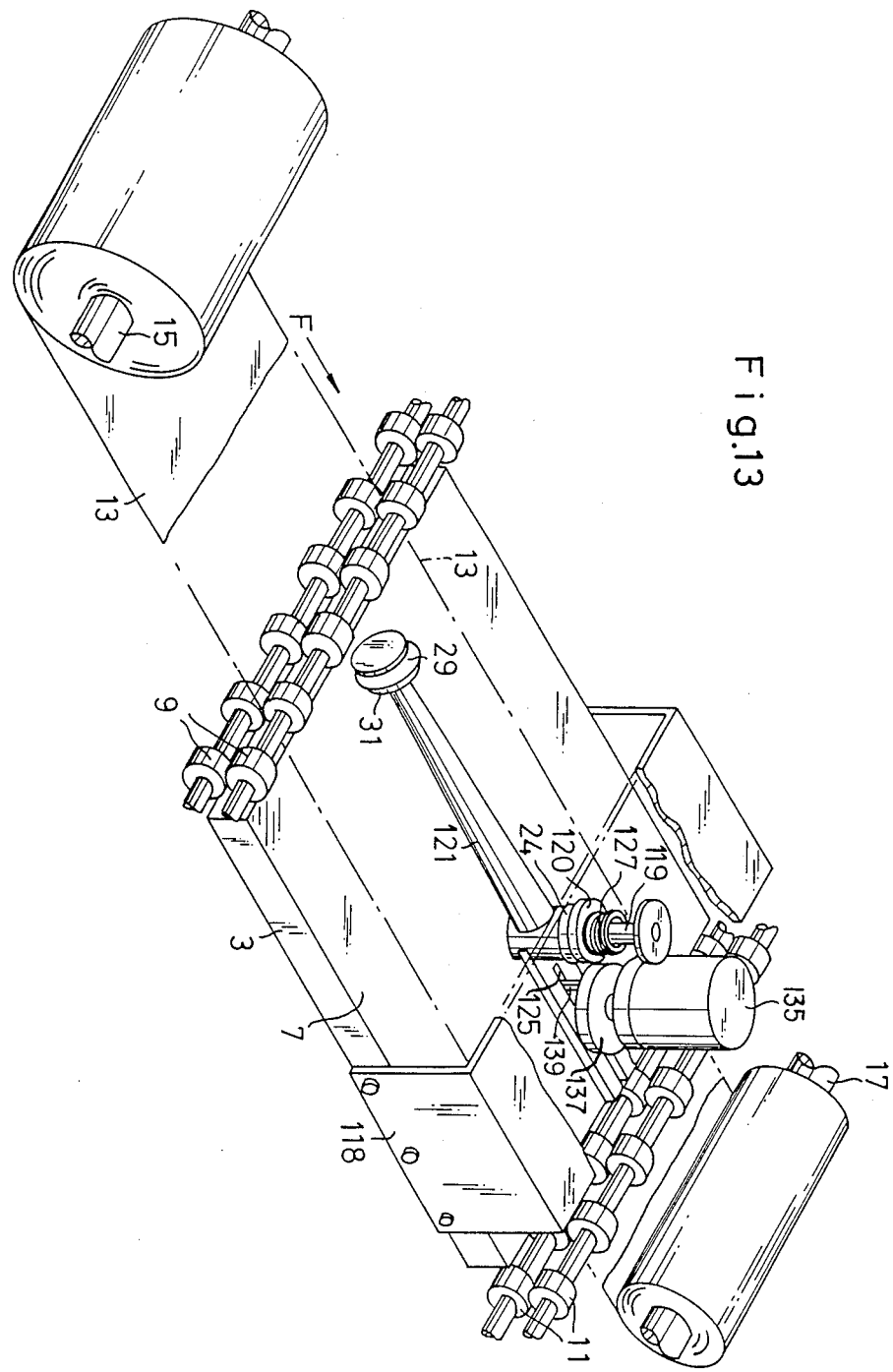
FIG. 13 is a diagrammatic perspective view showing yet still another modification of the image fixing device embodying the invention.
Figure 14:
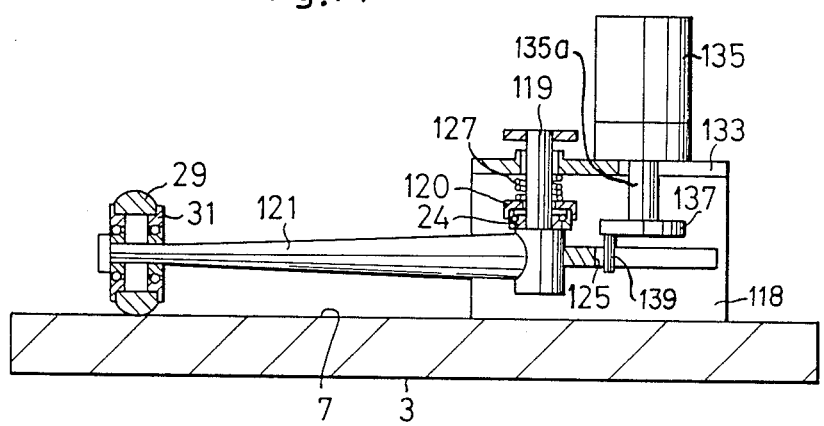
FIG. 14 is a vertical sectional view taken along the center of the longitudinal line of the device shown in FIG. 13.

FIGS. 13 and 14 illustrate another image fixing device embodying the invention. In these drawings, sections and members identical with those of the device shown in FIGS. 1 to 4 are accompanied by the identical numerals and detailed explanation thereof will be omitted.

In this embodiment, a relatively wide gantry 118 is bridged over a platform 7 of a frame 3. At the center of the gantry 118 is rotatably and axially displaceably supported a shaft 119. A swinging arm 121 is secured to an enlarged lower end of the shaft 119 and extend parallel with the platform 7. The arm 121 has substantially a conical configuration tapered into the free end, to which is rotatably connected a drum-shaped roller 29, via a ball bearing 31 allowing the free rotation of the roller 29 on the platform 7 or papers with friction therebetween. The opposite end of the arm 121 is shaped like a fork which provides therebetween an axially extending slot 125. A ring 120 is disposed above the lower end of the shaft 119, rotatably with respect to the shaft 119 through a ball bearing 24 interposed therebetween. A coil spring 127 is coiled around the shaft 119 between the lower face of the frame 118 and the ring 120 so that the shaft 119 is biased downwardly with resiliency of the coil spring 127.

Figure 15:
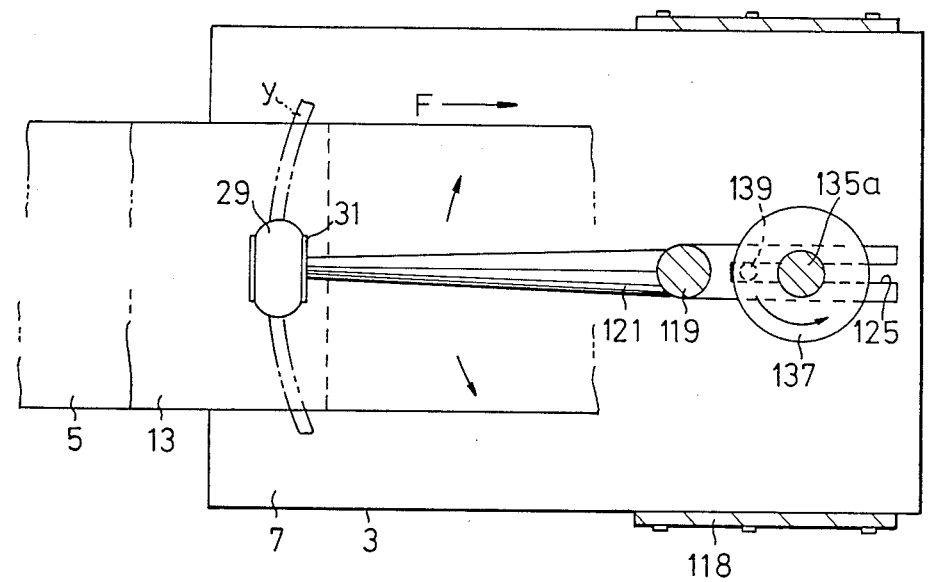
FIG. 15 is an explanatory view showing the operation of the device shown in FIG. 13.

A motor 135 is mounted on the frame 18, but is movable in the paper feeding direction (F) through engagement between a motor shaft 135a and a slot 133 formed in the frame 18. A rotary disc 137 is secured to the lower end of the motor shaft 135a and provided with a vertically extending eccentric rod 139 which is adapted to engage with the slot 125. Accordingly, when the disc 137 is rotated in a direction by the motor 135, the eccentric rod 139 engaged with the slot 125 will swing the arm 123 about the shaft 119 in the amplitude shown by imaginary lines in FIG. 15. The amplitude of the arm 123 is determined by a distance between the shaft 119 and the motor shaft 135a and also by a distance between the motor shaft 135a and the eccentric pin 139. The amplitude should be large enough to cover the entire width of the papers and may be easily adjusted by moving the position of the motor 135 along the slot 125 to change the distance between the motor shaft 135a and the arm shaft 119. Thus, the image fixing rollers 29 rolls over the papers in a direction substantially transversely of the paper feeding direction (F).

The devices described hereinabove are adapted to apply pressure to the surface of a capsule paper on which a latent image has been formed, to thereby rupture the uncured microcapsules to allow the inside developing agents to react with another material coated on a separate recording sheet. However, the image fixing device according to this invention can also be applied to recording medium of another type. For example, said another material reacting with the developing agent in the microcapsules is in some case coated also on the capsule paper, in which case the visible image is formed on the capsule paper itself. Alternatively, the device of the invention may be adapted to apply pressure to a recording medium having a provisional toner image electrostatically or electromagnetically formed thereon, to fix a stable toner image.

What is claimed is:

1. In an image fixing device of the type comprising support means for supporting thereon a recording medium on which a provisional image is formed, roller means adapted to roll over the surface of said recording medium in a direction substantially transversely of a feeding direction of said recording medium, and resilient means for applying a downward force to said roller means to thereby apply pressure to the surface of said recording medium for fixing said provisional image under pressure the improvement comprising a shaft extending vertically with respect to said support means; said roller means comprises one or more rollers connected to an arm swinging about said shaft; and means for varying the swing amplitude of said rollers.

2. The device according to claim 1 wherein said resilient means comprises a spring coiled around said shaft for biasing said shaft toward said support means.

3. The device according to claim 1 wherein said rollers are so shaped as to provide a minimum contact area with said recording medium, whereby resiliency of said resilient member is focused on a contact area of said recording medium.

4. The device according to claim 1 wherein said rollers move along an arc having a swing amplitude larger than the width of said recording medium.

5. In an image fixing device of the type comprising support means for supporting thereon a recording medium on which a provisional image is formed, roller means adapted to roll over the surface of said recording medium in a direction substantially transversely of a feeding direction of said recording medium, and resilient means for applying a downward force to said roller means to thereby apply pressure to the surface of said recording medium for fixing said provisional image under pressure the improvement comprising a contact plate attached to said support means, said contact plate being adapted to be positioned between said roller means and said recording medium and deformed when pressed by said roller means positioned thereon to transmit pressure to said recording medium.

6. The invention in accordance with claim 5 wherein said rollers move on a circular locus having a radius larger than the width of said recording medium.

7. The invention in accordance with claim 5 wherein said rollers move along an arc having a swing amplitude larger than the width of said recording medium.

8. The invention in accordance with claim 5 wherein said resilient means comprises a spring coiled about said shaft for biasing said shaft toward said support means.

9. In an image fixing device of the type comprising support means for supporting thereon a recording medium on which a provisional image is formed, roller means adapted to roll over the surface of said recording medium in a direction substantially transversely of a feeding direction of said recording medium, and resilient means for applying a downward force to said roller means to thereby apply pressure to the surface of said recording medium for fixing said provisional image under pressure the improvement comprising tensioning means for providing outwardly biasing tension against said recording medium for compensating an inwardly biasing tension which may be produced when said recording medium is pulled in the paper feeding direction and is pressured by said roller means.

10. The device according to claim 9 wherein said tensioning means comprises feed rollers positioned along both sides of said recording medium at an outwardly directing angle with respect to the paper feeding direction.

11. The invention in accordance with claim 9 wherein said rollers move on a circular locus having a radius larger than the width of said recording medium.

12. The invention in accordance with claim 9 wherein said rollers move along an arc having a swing amplitude larger than the width of said recording medium.

13. The invention in accordance with claim 9 wherein said resilient means comprises a spring coiled about said shaft for biasing said shaft toward said support means.

14. The invention in accordance with claim 9 wherein said rollers are shaped so as to provide a minimum contact area with said recording medium whereby the resiliency of said resilient means is focused on a contact area of said recording medium.

15. In an image fixing device of the type comprising support means for supporting thereon a recording medium on which a provisional image is formed, roller means adapted to roll over the surface of said recording medium in a direction substantially transversely of a feeding direction of said recording medium, and resilient means for applying a downward force to said roller means to thereby apply pressure to the surface of said recording medium for fixing said provisional image under pressure the improvement comprising a sensor for detecting the position of said roller means, a control device connected to said sensor for interrupting conveyance of said recording medium when said recording medium is pressed by said rollers positioned thereon.

16. The invention in accordance with claim 15 wherein said rollers move on a circular locus having a radius larger than the width of said recording medium.

17. The invention in accordance with claim 15 wherein said rollers move along an arc having a swing amplitude larger than the width of said recording medium.

18. The invention in accordance with claim 15 wherein said resilient means comprises a spring coiled about said shaft for biasing said shaft toward said support means.

19. The invention in accordance with claim 15 wherein said rollers are shaped so as to provide a minimum contact area with said recording medium whereby the resiliency of said resilient means is focused on a contact area of said recording medium.

20. In an image fixing device of the type comprising support means for supporting thereon a recording medium on which a provisional image is formed, roller means adapted to roll over the surface of said recording medium in a direction substantially transversely of a feeding direction of said recording medium, and resilient means for applying a downward force to said roller means to thereby apply pressure to the surface of said recording medium for fixing said provisional image under pressure the improvement comprising a shaft extending vertically with respect to said support means; said roller means comprises one or more rollers connected to an arm swinging about said shaft said rollers being moved on a circular locus having a radius larger than the width of said recording medium, said arm comprises a shaft spring having a conical configuration tapered into said rollers, and said resilient means includes said shaft spring.

21. The invention in accordance with claim 20 wherein said rollers are shaped so as to provide a minimum contact area with said recording medium whereby the resiliency of said resilient means is focused on a contact area of said recording medium.

* * * * *

UNITED STATES PATENT AND TRADEMARK OFFICE
CERTIFICATE OF CORRECTION

PATENT NO. : 4,872,032

DATED : October 3, 1989

INVENTOR(S) : Satoshi Watanabe et al.

It is certified that error appears in the above-identified patent and that said Letters Patent is hereby corrected as shown below: Title page:

Change the assignee from "BROTHER KOGYOKABUSHIKI KAISHA" to -- BROTHER KOGYO KABUSHIKI KAISHA --.

Signed and Sealed this

Twenty-seventh Day of November, 1990

*Attest:*

HARRY F. MANBECK, JR.

*Attesting Officer*      *Commissioner of Patents and Trademarks*